(12) United States Patent
Seima et al.

(10) Patent No.: US 11,336,155 B2
(45) Date of Patent: May 17, 2022

(54) CIRCUIT BOARD, MOTOR UNIT, AND FAN

(71) Applicant: MINEBEA MITSUMI Inc., Nagano (JP)

(72) Inventors: Toshiaki Seima, Yonago (JP); Koichi Tamai, Kakegawa (JP); Haruomi Morohashi, Hamamatsu (JP); Kazuaki Saito, Hamamatsu (JP)

(73) Assignee: MINEBEA MITSUMI Inc., Nagano (JP)

( * ) Notice: Subject to any disclaimer, the term of this patent is extended or adjusted under 35 U.S.C. 154(b) by 310 days.

(21) Appl. No.: 16/644,700

(22) PCT Filed: Jun. 29, 2018

(86) PCT No.: PCT/JP2018/024866
§ 371 (c)(1),
(2) Date: Mar. 5, 2020

(87) PCT Pub. No.: WO2019/054013
PCT Pub. Date: Mar. 21, 2019

(65) Prior Publication Data
US 2020/0288565 A1    Sep. 10, 2020

(30) Foreign Application Priority Data
Sep. 12, 2017   (JP) .............. JP2017-174462

(51) Int. Cl.
*H02K 11/33*     (2016.01)
*H02K 29/08*     (2006.01)
(Continued)

(52) U.S. Cl.
CPC ............ *H02K 11/33* (2016.01); *H02K 29/08* (2013.01); *H05K 1/0224* (2013.01); *H05K 1/181* (2013.01)

(58) Field of Classification Search
CPC ............... H05K 1/0224; H05K 1/181; H05K 2201/1009; H05K 2201/10166;
(Continued)

(56) References Cited

U.S. PATENT DOCUMENTS

| 2007/0000684 A1* | 1/2007 | Harada ............... H05K 1/0269 174/250 |
| 2012/0161689 A1* | 6/2012 | Yamasaki ............. H02P 25/22 361/679.4 |
| 2013/0175012 A1* | 7/2013 | Yamada .................. F28F 1/00 318/472 |

FOREIGN PATENT DOCUMENTS

| JP | 09-285075 A | 10/1997 |
| JP | 2007-012771 A | 1/2007 |

(Continued)

OTHER PUBLICATIONS

English translation of the Written Opinion for corresponding International Application No. PCT/JP2018/024866 dated Sep. 4, 2018.
(Continued)

*Primary Examiner* — Mohamad A Musleh
(74) *Attorney, Agent, or Firm* — Pearne & Gordon LLP

(57) ABSTRACT

To improve the EMC performance of an electronic device on which a motor is mounted. A circuit board (12) comprises a substrate (130), lands (P4, P5) that are formed on a main surface (131) of the substrate (130) and are for connecting a coil (17) of the motor (11), a magnetic detection element (122) that outputs a detection signal corresponding to a position of a rotor (14) of the motor (11), and a motor drive control IC (121) that generates drive signals (VOUTA, VOUTB) for driving the motor (11) based on the detection signal, wherein the magnetic detection element (122) and the motor drive control IC (121) are arranged in a region (AR1) on a side of a minor angle (θ) formed by a first straight line (a) and a second straight line (b) among regions
(Continued)

that are on the main surface and are defined by the first straight line and the second straight line when viewing the substrate (130) from the main surface side, the first straight line connecting the land (P4) and an axis of an output shaft of the motor (11), the second straight line connecting the land (P5) and the axis of the motor (11).

14 Claims, 5 Drawing Sheets

(51) Int. Cl.
  *H05K 1/02* (2006.01)
  *H05K 1/18* (2006.01)
(58) Field of Classification Search
  CPC . H05K 1/18; H05K 9/00; H02K 11/33; H02K 29/08; H02K 1/187; H02K 11/215; H02K 21/22
  See application file for complete search history.

(56) References Cited

FOREIGN PATENT DOCUMENTS

| JP | 2009-148103 A | 7/2009 |
| JP | 2015-060879 A | 3/2015 |

OTHER PUBLICATIONS

International Preliminary Report on Patentability for corresponding International Application No. PCT/JP2018/024866 dated Mar. 17, 2020.

Japanese Office Action dated Mar. 29, 2021 for corresponding Japanese Application No. 2017-174462 and English translation.

International Search Report for corresponding International Application No. PCT/JP2018/024866 dated Sep. 4, 2018.

Written Opinion for corresponding International Application No. PCT/JP2018/024866 dated Sep. 4, 2018.

* cited by examiner

CIRCUIT BOARD, MOTOR UNIT, AND FAN

TECHNICAL FIELD

The present invention relates to a circuit board, a motor unit, and a fan, and particularly relates to a circuit board on which a motor driving control circuit for controlling driving of a motor is mounted, a motor unit provided with the circuit board and the motor, and a fan provided with the motor unit and an impeller.

BACKGROUND ART

In general, high-level electro-magnetic compatibility (EMC) is required for electronic devices for on-vehicle use. Here, the EMC performance includes both having the electro magnetic susceptibility (EMS) exhibiting the resistance of the electronic device to electromagnetic noise from the outside and preventing the occurrence of the electro magnetic interference (EMI) in which the communication radio wave emitted by the electronic device and the high-frequency electromagnetic wave noise have adverse effects on the surrounding electronic devices and a human body.

However, it is hard to say that the electronic device on which the motor is mounted provides good EMC performance. For example, in the fan for on-vehicle use, electric wires for power supply, electric wires for signal communication and the like are connected to a circuit board on which the motor driving control circuit for controlling driving of a motor is mounted. Therefore, the motor driving control circuit may malfunction due to electromagnetic noise that is incident from the outside through these electric wires, which may cause reduction in EMS.

In addition, a driving circuit (inverter circuit) for driving a motor, which is one of components of the motor driving control circuit, includes a semiconductor switching element such as a bipolar transistor and an FET, the semiconductor switching element being configured to drive the motor (coil) with a large current. Therefore, the driving circuit itself serves as a source of electromagnetic noise, which may cause increase in EMI.

Thus, it is hard to say that the electronic device on which the motor of the fan or the like is mounted provides good EMC performance. Research to improve EMC performance of the electronic device on which the motor is mounted has been being conducted.

For example, Patent Literature 1 discloses a technique for improving the EMC performance of a circuit board unit on which a motor is mounted. Specifically, Patent Literature 1 discloses the circuit board unit in which the circuit board on which a circuit for controlling the motor is mounted is covered by a case made of metal, resulting that the electromagnetic wave that is emitted from the circuit board is shielded and the electromagnetic wave that is incident from the outside to the circuit board is shielded.

DOCUMENT LIST

Patent Literature

Patent Literature 1: Japanese Patent Application Publication No. 2015-60879

SUMMARY OF INVENTION

Technical Problem

In recent years, the miniaturization of the motor for on-vehicle use has been recently progressing. In accordance with the trend, there are continuing demands for miniaturization and density increase of circuit boards on which the motor control circuit for controlling the motor for on-vehicle use motor is mounted. Therefore, in the fan for on-vehicle use, it has become more difficult to satisfy the required EMC performance.

Specifically, since in the circuit board built in the small fan, an area in which the electronic components may be mounted is small and the wiring flexibility is low by restrictions of dimensions and contours of the bearing supporting the output shaft of the motor, it is not easy to satisfy the EMC performance required for on-vehicle use. For example, when the technique of Patent Literature 1 described above is applied, the probability of improving the EMC performance of the motor driving control circuit is high, but it is difficult to miniaturize the fan.

The present invention has been made in view of the above problems, and an object of the present invention is to improve EMC performance of an electronic device on which a motor is mounted.

Solution to Problem

A circuit board according to a representative embodiment of the present invention is a circuit board of a motor unit on which a motor is mounted, and is characterized by comprising a substrate having a main surface which is one of a pair of surfaces facing back to back each other and a back surface which is another of the pair of surfaces, a first land and a second land that are formed on the main surface and are for connecting a coil of the motor, a magnetic detection element that outputs a detection signal corresponding to a position of a rotor of the motor, and a motor drive control IC that generates drive signals for driving the motor based on the detection signal, wherein the magnetic detection element and the motor drive control IC are arranged in a region on a side of an minor angle formed by a first straight line and a second straight line among regions that are on the main surface and are defined by the first straight line and the second straight line when viewing the substrate from the main surface side, the first straight line connecting the first land and an axis of an output shaft of the motor, the second straight line connecting the second land and the axis of the motor.

Effects of Invention

According to one aspect of the present invention, the EMC performance of an electronic device on which a motor is mounted can be improved.

DESCRIPTION OF EMBODIMENTS

1. Overview of Embodiment

Figure 1:
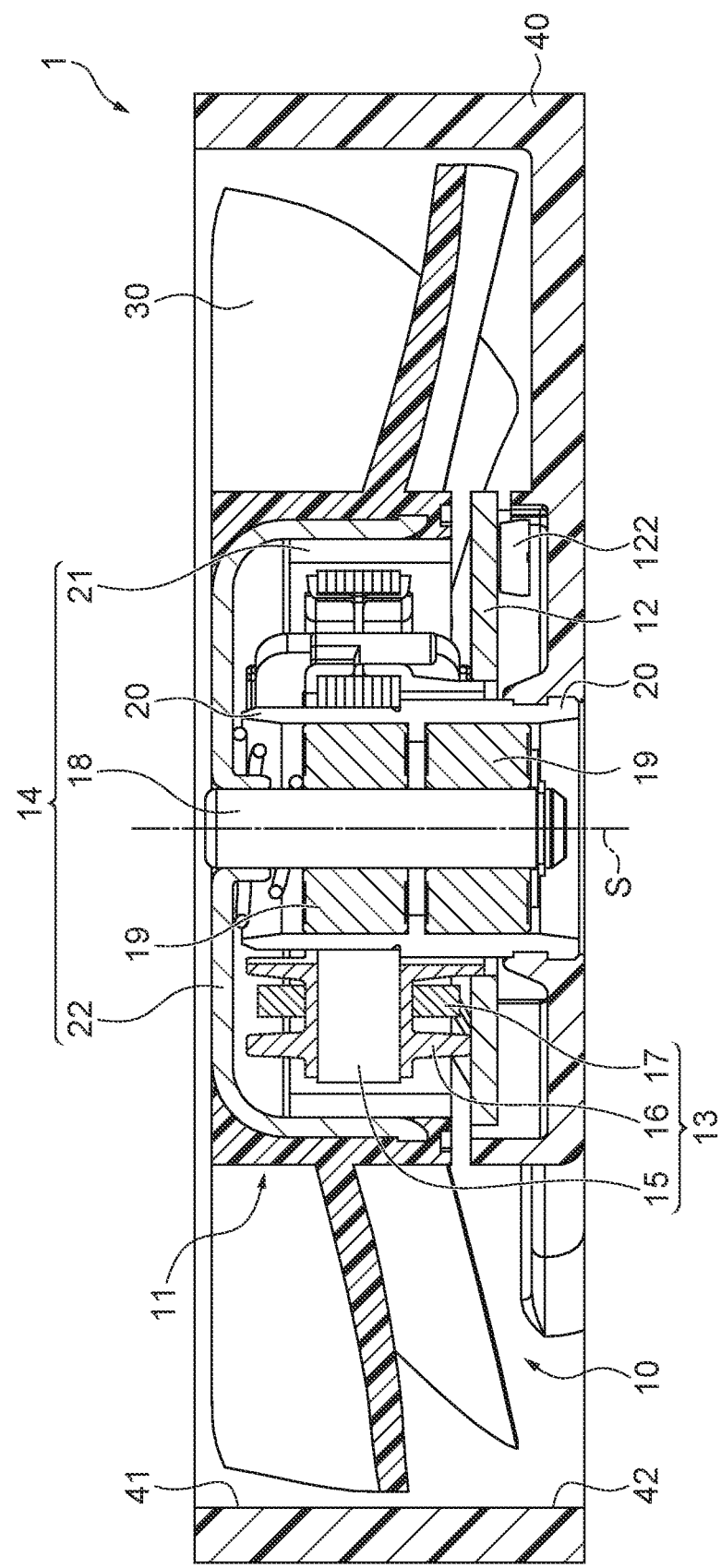
FIG. 1 A diagram illustrating a configuration of a fan according to an embodiment of the present invention.

First, an overview of a representative embodiment of the invention disclosed in the present application will be described. Note that in the following description, the reference characters in the drawings corresponding to the constituent elements of the invention are indicated in parentheses as examples.

[1] A circuit board (12) according to a representative embodiment of the present invention is a circuit board of a motor unit (10) on which a motor (11) is mounted, and comprises a substrate (130) having a main surface (131) which is one of a pair of surfaces facing back to back each other and a back surface (132) which is another of the pair of surfaces, a first land (P4) and a second land (P5) that are formed on the main surface (131) and are for connecting a coil (17) of the motor, a magnetic detection element (122) that outputs a detection signal corresponding to a position of a rotor (14) of the motor, and a motor drive control IC (121) that generates drive signals (VOUTA, VOUTB) for driving the motor based on the detection signal, wherein the magnetic detection element and the motor drive control IC are arranged in a region (AR1) on a side of an minor angle (θ) formed by a first straight line (a) and a second straight line (b) among regions that are on the main surface and are defined by the first straight line and the second straight line when viewing the substrate from the main surface side, the first straight line connecting the first land and an axis of an output shaft of the motor, the second straight line connecting the second land and the axis of the motor.

[2] In the above-described circuit board, the minor angle (θ) formed by the first straight line and the second straight line may be 90 degrees or less.

[3] The above-described circuit board further comprises a ground electrode (P2) that is formed on one of the main surface and the back surface and is supplied with a ground voltage from an outside, and a transistor (Q1) that includes a control electrode (B), a first main electrode (E) connected to the ground electrode, and a second main electrode (C) and that is arranged on the main surface, wherein the motor drive control IC may include a ground terminal (GND1) for inputting the ground voltage (VGND), a first input terminal (INP) and a second input terminal (INN) each for inputting the detection signal, a first output terminal (OUTA) and a second output terminal (OUTS) that output the drive signals generated based on the detection signals input from the first input terminal and the second input terminal, respectively, and a third output terminal (FGOUT) that outputs a periodic signal (Vfg) corresponding to a rotational speed of the motor generated based on the voltage input to the ground terminal, the control electrode of the transistor may be connected to the third output terminal of the motor drive control IC, and on the substrate, the ground terminal and the first main electrode may be connected to the ground electrode through wires (138_1 to 138_3, and 136) common to each other.

[4] In the above-described circuit board, one of the first main electrode and the ground terminal may be connected to the ground electrode through a ground connection path (a connection wiring path to the ground electrode) connecting another of the first main electrode and the ground terminal and the ground electrode.

[5] The above-described circuit board further comprises a discontinuous annular solid pattern (136) formed of a metal thin film that is formed on the back surface of the substrate, wherein the solid pattern may be connected to the ground electrode, the ground terminal and the first main electrode.

[6] In the above-described circuit board, the solid pattern may extend from a region overlapping with the ground electrode to a region overlapping with the first main electrode through a region overlapping with the ground terminal, when viewing the substrate from the back surface side.

[7] In the above-described circuit board, the substrate has a plurality of wiring patterns (141 to 146, 136, and 138_1 to 138_4), and the wiring patterns (141 to 146) other than the wiring patterns (136, and 138_1 to 138_4) among the plurality of wiring patterns may be formed only on the main surface, the wiring patterns (136, and 138_1 to 138_4) being to be supplied with the ground voltage.

[8] A circuit board (12) according to another representative embodiment of the present invention is a circuit board of a motor unit (10) on which a motor (11) is mounted, and comprises a substrate (130) having a main surface (131) which is one of a pair of surfaces facing back to back each other and a back surface (132) which is another of the pair of surfaces, a ground electrode (P2) that is formed on any one of the main surface and the back surface and is supplied with a ground voltage (VGND) from an outside, a motor drive control IC (121) that is arranged on the main surface of the substrate and generates a drive signal for driving the motor and generates a periodic signal (Vfg) having a frequency corresponding to a rotational speed of the motor, and a transistor (Q1) that includes a control electrode (B), a first main electrode (E) connected to the ground electrode, and a second main electrode (C) and that is arranged on the main surface, wherein the motor drive control IC may include a ground terminal (GND1) for inputting the ground voltage, a first output terminal (OUTA) and a second output terminal (OUTS) that output the respective drive signals, and a third output terminal (FGOUT) that outputs the periodic signal generated with a voltage of the ground terminal as a reference, the control electrode of the transistor may be connected to the third output terminal of the motor drive control IC, and on the substrate, the ground terminal and the first main electrode may be connected to the ground electrode through wires (138_1 to 138_3, and 136) common to each other.

[9] In the above-described circuit board, one of the first main electrode and the ground terminal may be connected to the ground electrode through a ground connection path connecting another of the first main electrode and the ground terminal and the ground electrode.

[10] The above-described circuit board further comprises a discontinuous annular solid pattern (136) formed of a metal thin film that is formed on the back surface of the substrate, wherein the solid pattern may be connected to the ground electrode, the ground terminal and the first main electrode.

[11] In the above-described circuit board, the solid pattern may extend from a region overlapping with the ground electrode to a region overlapping with the first main electrode through a region overlapping with the ground terminal, when viewing the substrate from the back surface side.

[12] In the above-described circuit board, the substrate has a plurality of wiring patterns (138_1 to 138_4, and 141 to 146), and the wiring patterns other than the wiring patterns to be supplied with the ground voltage among the plurality of wiring patterns may be formed only on the main surface.

[13] A motor unit (10) according to a representative embodiment of the present invention comprises the circuit board (12) and the motor (11).

[14] A fan (1) according to a representative embodiment of the present invention comprises the motor unit (10) and an impeller (30) configured to be rotatable by a rotational force of the motor.

2. Specific Example of Embodiment

Hereinafter, specific examples of embodiments of the present invention will be described with reference to the drawings. Note that in the following descriptions, common constituent elements in the embodiments are denoted by the same reference numerals, and redundant description is omitted. Note that the drawings illustrate schematic forms, and the dimensional relationship among the elements, the magnification of each element, and the like may differ from actual situation. Among the drawings also, inconsistency in the dimensional relationship or in the magnification may be included.

FIG. 1 is a diagram illustrating a configuration of a fan according to an embodiment of the present invention. FIG. 1 illustrates a cross-sectional shape of a fan 1 according to the present embodiment.

The fan 1 is a device for generating wind by rotating an impeller, and is, for example, a device that discharges the heat generated in an equipment device to the outside to cool the inside of the equipment.

Specifically, as illustrated in FIG. 1, the fan 1 includes a motor unit 10, an impeller 30, and a case 40. The case 40 is a housing for accommodating the motor unit 10 and the impeller 30, and is made of, for example, resin. Openings 41 and 42 are formed in the case 40 so that the wind generated by the fan passes through the openings 41 and 42.

The impeller 30 is a component that rotates to generate wind. The impeller 30 is configured to be rotatable by a rotational force of the motor 11.

The motor unit 10 is configured to include the motor 11 that generates the rotational force for rotating the impeller 30, and a circuit board 12 on which a motor driving control circuit 120 for controlling driving of the motor 11 is formed.

The motor 11 is, for example, a single-phase brushless DC motor. Specifically, the motor 11 includes a stator 13 and a rotor 14. The stator 13 includes a stator core 15, an insulator 16, and a coil 17. The rotor 14 includes an output shaft 18, a bearing 19, a bearing housing 20, a magnet (permanent magnet) 21, and a rotor yoke 22. The impeller 30 is connected to the output shaft 18.

A current flows in the coil 17 from the motor driving control circuit 120, and a direction of the current is periodically switched, so that the rotor 14 is rotated. Thus, the impeller 30 connected to the output shaft 18 of the rotor 14 is rotated, which can cause the wind to be generated.

Next, the motor driving control circuit 120 will be described in detail.

Figure 2:
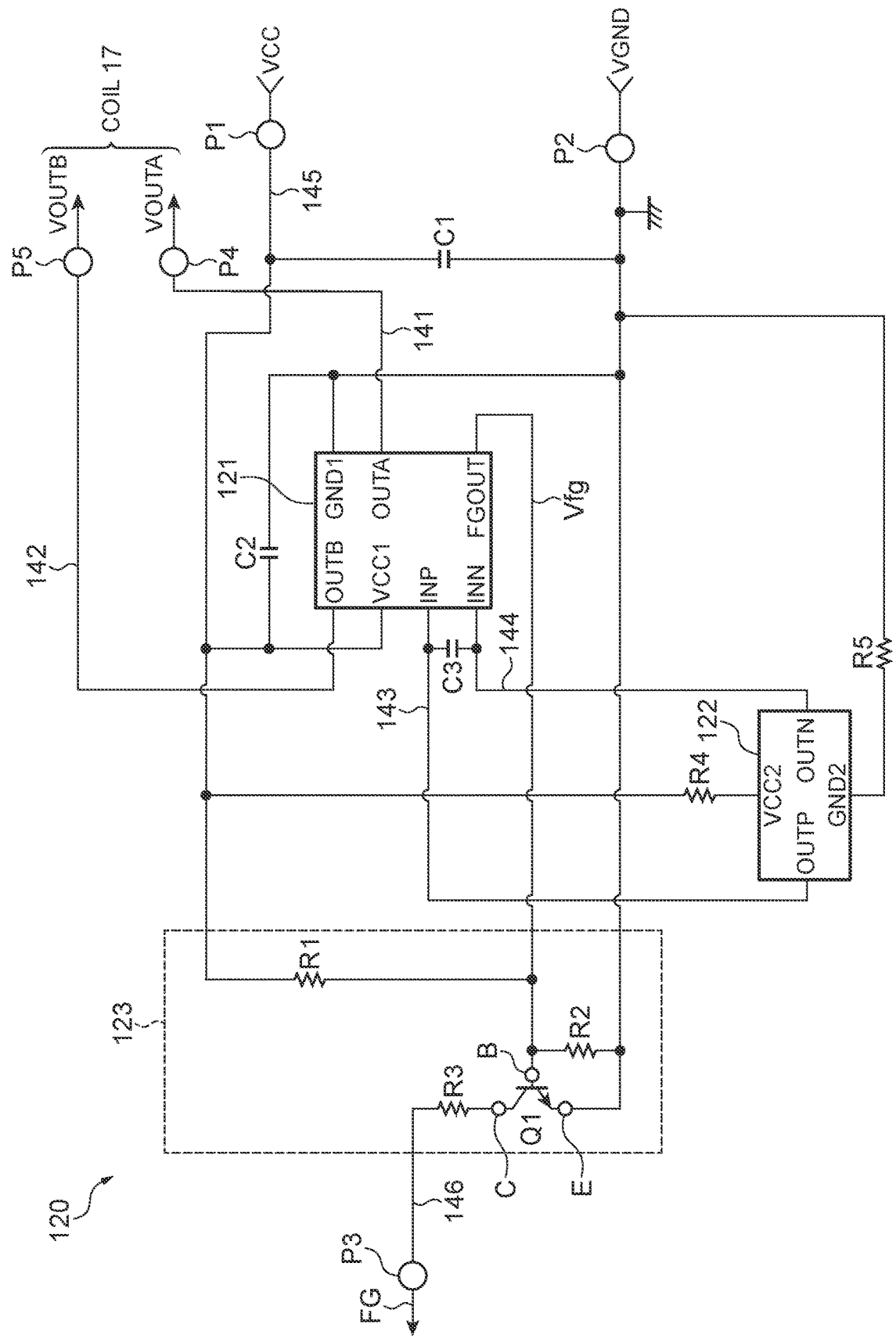
FIG. 2 A diagram illustrating a circuit configuration of a motor driving control circuit 120.

FIG. 2 is a diagram illustrating a circuit configuration of the motor driving control circuit 120.

As illustrated in FIG. 2, the motor driving control circuit 120 includes a motor drive control IC (Integrated Circuit) 121, a magnetic detection element 122, a signal output circuit 123, resistors R4 and R5, capacitors C1 to C3, and a plurality of external electrodes P1 to P5.

The external electrode P1 is a terminal that is supplied with a power supply voltage VCC from the outside. The external electrode P2 is a terminal that is supplied with a ground voltage VGND from the outside. A capacitor C1 serving as a stabilized capacitor is connected between the external electrode P1 and the external electrode P2. Hereinafter, the external electrode P1 and the external electrode P2 may be referred to as a "power supply electrode P1" and a ground electrode P2," respectively.

The external electrode P3 is a terminal that outputs a signal FG described later. The external electrodes P4 and P5 are terminals for connecting to the coil 17 of the motor 11.

The magnetic detection element 122 is a component that detects a position of the rotor 14 of the motor 11, and is, for example, a Hall element, a Hall IC, or the like. The magnetic detection element 122 includes a power supply terminal VCC2, a ground terminal GND2, and output terminals OUTP and OUTN. The power supply terminal VCC2 of the magnetic detection element 122 is connected to the power supply electrode P1 through the resistor R4, and the ground terminal GND2 of the magnetic detection element 122 is connected to the ground electrode P2 through the resistor R5. The output terminal OUTP of the magnetic detection element 122 is connected to a first input terminal INP of a motor drive control IC 121 described later, and the output terminal OUTN of the magnetic detection element 122 is connected to a second input terminal INN of the motor drive control IC 121 described later.

The magnetic detection element 122 is operated when the power supply voltage VCC is supplied to the power supply terminal VCC2, and the ground voltage VGND is supplied to the ground terminal GND2. Specifically, the magnetic detection element 122 detects a position of the rotor 14 of the motor 11, generates a detection signal corresponding to the detected position of the rotor 14, and outputs the detection signal from the output terminal OUTP and the output terminal OUTN.

The motor drive control IC 121 is a semiconductor integrated circuit that generates drive signals VOUTA and VOUTB for driving the motor 11 based on the detection signal output from the magnetic detection element 122 and generates a periodic signal Vfg corresponding to a rotational speed of the motor 11.

The motor drive control IC 121 is formed by accommodating, in one package, a chip formed on a single semiconductor substrate such as a silicon substrate, using a fabrication technology of, for example, a known complementary metal-oxide-semiconductor field effect transistor (CMOS) LSI, or the like.

The motor drive control IC 121 includes a power supply terminal VCC1, a ground terminal GND1, a first input terminal INP, a second input terminal INN, a first output terminal OUTA, a second output terminal OUTB, and a third output terminal FGOUT.

The power supply terminal VCC1 is connected to the power supply electrode P1. The ground terminal GND1 is connected to the ground electrode P2. A capacitor C2 serving as a stabilized capacitor is connected between the power supply terminal VCC1 and the ground terminal GND1. The first output terminal OUTA is connected to the external electrode P4. The second output terminal OUTB is connected to the external electrode P5. The third output terminal FGOUT is connected to a base electrode (an example of a control electrode) B of a transistor Q1 described later.

As described above, the first input terminal INP is connected to the output terminal OUTP of the magnetic detection element 122, and the second input terminal INN is connected to the output terminal OUTN of the magnetic detection element 122. A capacitor C3 is connected between the first input terminal INP and the second input terminal INN.

The motor drive control IC 121 is operated when the power supply voltage VCC is supplied to the power supply terminal VCC1, and the ground voltage VGND is supplied to the ground terminal GND1. The motor drive control IC 121 generates the drive signals VOUTA and VOUTB to be supplied to the coil 17 of the motor 11, and outputs the drive signals VOUTA and VOUTB from the first output terminal OUTA and the second output terminal OUTB, respectively. The motor drive control IC 121 switches the polarities of the voltages of the drive signals VOUTA and VOUTB based on the detection signals input to the first input terminal INP and the second input terminal INN from the magnetic detection element 122. In this way, the direction of the current flowing in the coil 17 of the motor 11 is periodically switched, so that the rotor 14 is rotated.

The motor drive control IC 121 generates the periodic signal Vfg having a frequency corresponding to a rotational speed of the rotor 14 with the voltage of the ground terminal GND1 as a reference, based on the detection signals input to the first input terminal INP and the second input terminal INN from the magnetic detection element 122, and outputs the periodic signal Vfg from the third output terminal FGOUT.

The periodic signal Vfg is a pulse signal of a high level for turning on the transistor Q1 or a pulse signal of a low level for turning off the transistor Q1, and has a frequency proportional to the rotational speed of the rotor 14.

The signal output circuit 123 is a circuit for outputting, to the external electrode P3, the periodic signal Vfg output from the third output terminal FGOUT of the motor drive control IC 121. Specifically, the signal output circuit 123 is configured to include the transistor Q1 and resistors R1, R2 and R3.

The transistor Q1 is, for example, a bipolar transistor. The periodic signal Vfg is supplied to a base electrode B as an example of the control electrode of the transistor Q1. For example, the base electrode B of the transistor Q1 is connected to the third output terminal FGOUT of the motor drive control IC 121. The resistor R1 is connected between the base electrode B and the power supply electrode P1, and the resistor R2 is connected between the base electrode B and the ground electrode P2. An emitter electrode E, as an example of the first main electrode of the transistor Q1, is connected to the ground electrode P2. A collector electrode C, as an example of the second main electrode of the transistor Q1, is connected to the external electrode P3 through the resistor R3.

In the signal output circuit 123, when the periodic signal Vfg output from the third output terminal FGOUT of the motor drive control IC 121 is smaller than a threshold of a voltage between the base electrode B and the emitter electrode E of the transistor Q1, that is, the periodic signal Vfg is at a low level, the transistor Q1 is turned off and the external electrode P3 is opened. On the other hand, when the periodic signal Vfg is larger than the threshold of the voltage between the base electrode B and the emitter electrode E of the transistor Q1, that is, the periodic signal Vfg is at a high level, the transistor Q1 is turned on, and the external electrode P3 and the ground electrode P2 become conductive through the resistor R3. Accordingly, when an appropriate load is connected to the external electrode P3, a signal FG synchronized with the periodic signal Vfg is output from the external electrode P3.

As described above, the motor driving control circuit 120 is formed by the circuit board 12. The circuit board 12 have various configurations for improving the EMC performance of the fan 1. Hereinafter, the circuit board 12 will be described in detail.

Figure 3A:
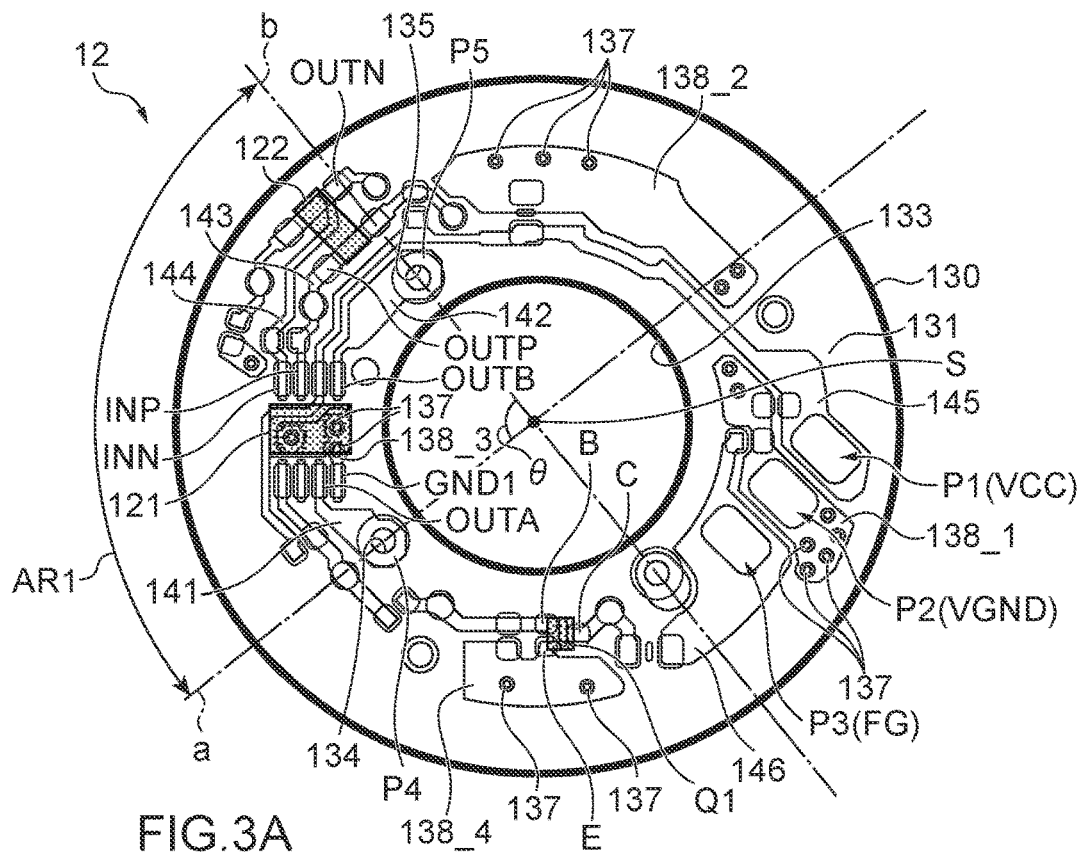
FIG. 3A A diagram illustrating a configuration of a main surface 131 side of a circuit board 12 according to an embodiment of the present invention.
Figure 3B:
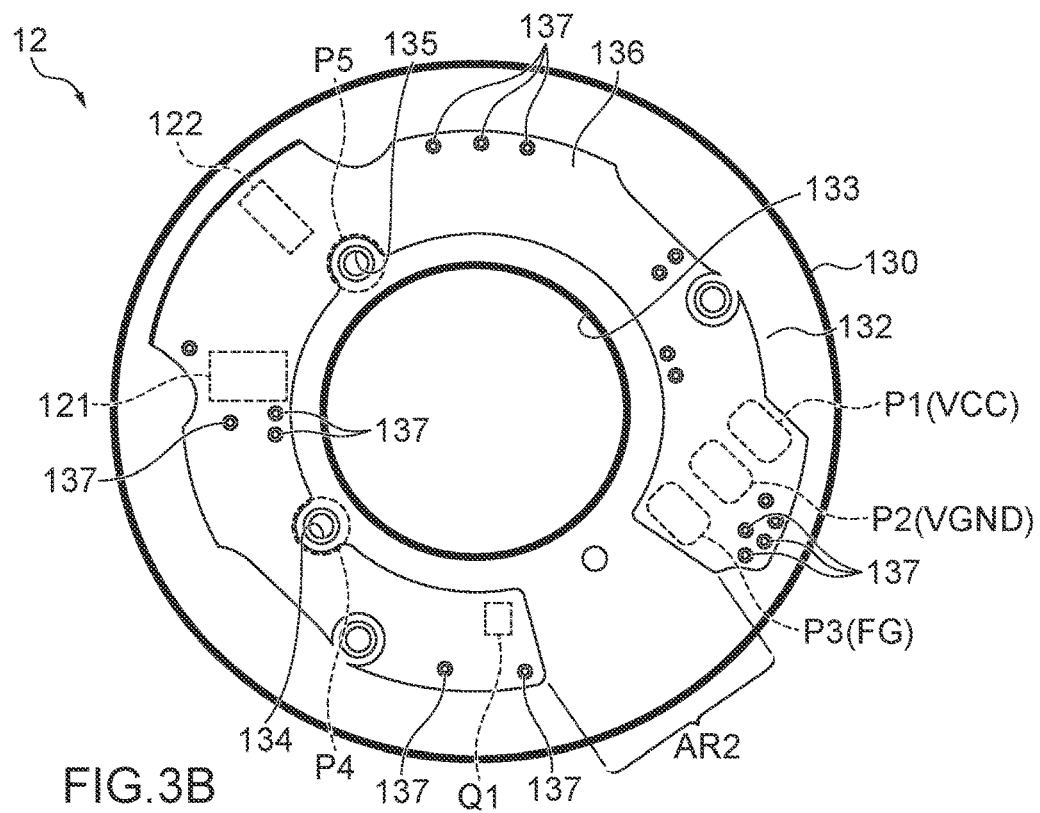
FIG. 3B A diagram illustrating a configuration of a back surface 132 side of the circuit board 12 according to an embodiment of the present invention.

FIGS. 3A and 3B each are a diagram illustrating a configuration of the circuit board 12 according to an embodiment of the present invention.

FIG. 3A illustrates a plan view of the main surface 131 side of the circuit board 12 (the substrate 130). FIG. 3B illustrates a plan view of the back surface 132 side of the circuit board 12 (the substrate 130).

The circuit board 12 illustrated in FIGS. 3A and 3B includes the substrate 130 and various electronic components mounted on the substrate 130.

The circuit board 12 is a printed circuit board in which the motor driving control circuit 120 is formed by mounting electronic components including the motor drive control IC 121, the magnetic detection element 122, the transistor Q1, the resistors R1 to R5, and the capacitors C1 to C3 on the substrate 130 and connecting the electronic components to one another through the wiring patterns formed on the substrate 130.

The substrate 130 is a printed wired board (PWB) in which a plurality of wiring patterns formed of, for example, a metal thin film (for example, copper foil) are formed. As illustrated in FIGS. 3A and 3B, the substrate 130 includes the main surface 131 which is one of a pair of surfaces facing back to back each other and a back surface 132 which is another of the pair of surfaces. The substrate 130 is, for example, a two-layer substrate (double-sided substrate) in which the main surface 131 serves as a first wire layer, and the back surface 132 serves as a second wire layer.

The substrate 130 is formed in an annular (ring) shape in a plan view. Specifically, a through-hole 133 having a circular shape that penetrates the main surface 131 and the back surface 132 is formed in a center portion of the substrate 130 having a circular contour in a plan view. The through-hole 133 is a hole for installing a part of the motor 11 therein. Specifically, as illustrated in FIG. 1, when the fan 1 (the motor unit 10) is assembled as a product, the output shaft 18, the bearing 19, and the bearing housing 20 of the motor 11 are arranged in the through-hole 133 of the substrate 130.

Note that, in FIGS. 3A and 3B, when the fan 1 is assembled, an axis of the output shaft 18 is denoted by a reference character "S."

The external electrodes P1 to P3 are formed on the main surface 131 of the substrate 130. The external electrodes P1 to P3 include the wiring patterns formed of, for example, a metal thin film.

On the main surface 131, lands for connecting the coil 17 of the motor 11 are formed as the external electrodes P4 and P5. Hereinafter, the lands as the external electrodes P4 and P5 are referred to as a "land (an example of a first land) P4"

and a "land (an example of a second land) P5," respectively. The lands P4 and P5 include the wiring patterns formed of, for example, a metal thin film. Through-holes 134 and 135 that penetrate the main surface 131 and the back surface 132 are formed on the wiring patterns forming the lands P4 and P5, respectively. The through-holes 134 and 135 are formed, for example, in a circular shape in a plan view.

The electronic components including the above-described motor drive control IC 121, magnetic detection element 122, transistor Q1, resistors R1 to R5, and capacitors C1 to C3 are mounted on the main surface 131.

Note that, in FIG. 3A, for convenience of explanation, the motor drive control IC 121, the magnetic detection element 122, and the transistor Q1 are modeled and represented so that the wiring patterns on the main surface 131 that exist under the motor drive control IC 121, the magnetic detection element 122, and the transistor Q1 can been seen through the motor drive control IC 121, the magnetic detection element 122, and the transistor Q1. In addition, in FIG. 3A, other electronic components including the resistors R1 to R5 and the capacitors C1 to C3 are not illustrated.

Furthermore, on the main surface 131, the electronic components mounted as described above and a plurality of wiring patterns formed of a metal thin film are formed, the wiring patterns being provided for connecting the external electrodes P1 to P5 to one another.

As illustrated in FIG. 3A, in the circuit board 12, the wiring patterns to be connected to the ground electrode P2 among the wiring patterns are referred to as "wiring patterns 138_1 to 138_4."

As illustrated in FIG. 3B, a solid pattern 136 formed of a metal thin film is formed on the back surface 132 of the substrate 130. In the solid pattern 136, the plurality of wiring patterns 138_1 to 138_4 formed on the main surface 131 are connected by a plurality of through vias 137 penetrating the main surface 131 and the back surface 132 of the substrate 130. Thus, the solid pattern 136 and the wiring patterns 138_1 to 138_4 are electrically connected with the ground electrode P2.

Here, to improve the EMC performance of the fan 1, the motor drive control IC 121 and the magnetic detection element 122 are arranged on the substrate 130 as described below.

In the main surface 131 of the substrate 130, consider a case where a virtual first straight line a connecting the land P4 and a position S of the axis of the output shaft 18 of the motor 11 and a virtual second straight line b connecting the land P5 and the position S of the axis of the output shaft 18 of the motor 11 are drawn. For example, the first straight line a is drawn to pass through a center of the through-hole 134 of the land P4 and the position S, and the second straight line b is drawn to pass through a center of the through-hole 135 of the land P5 and the position S. In this case, the magnetic detection element 122 and the motor drive control IC 121 are arranged in a region AR1 on a side of an minor angle θ formed by the first straight line a and the second straight line b among regions on the main surface 131 defined by the first straight line a and the second straight line b when viewing the substrate 130 from the main surface 131 side.

When the motor 11 is a single-phase motor, it is preferable that the minor angle θ is 90 degrees or less.

As illustrated in FIGS. 3A and 3B, in the circuit board 12, the ground terminal GND1 of the motor drive control IC 121 and the emitter electrode E of the transistor Q1 are connected to the ground electrode P2 through wires common to each other. For example, as illustrated in FIGS. 3A and 3B, the ground terminal GND1 and the emitter electrode E are connected to the ground electrode P2 through common wires including a part of the solid pattern 136, the wiring patterns 138_1, 138_2, and 138_3, and the through vias 137.

In other words, the emitter electrode E of the transistor Q1 is connected to the ground electrode P2 through a connection path (hereinafter, also referred to as a "ground connection path") connecting the ground terminal GND1 of the motor drive control IC 121 and the ground electrode P2.

Here, in the circuit board 12 according to the present embodiment, the above-described ground connection path is formed by common wires including, for example, a part of the solid pattern 136, the wiring patterns 138_1, 138_2, and 138_3, and the through vias 137.

For example, as illustrated in FIGS. 3A and 3B, the solid pattern 136 is formed in a discontinuous annular shape extending from the ground electrode P2 to the emitter electrode E through a connection with the ground terminal GND1.

The solid pattern 136 is connected to the ground electrode P2, the ground terminal GND1, and the emitter electrode E. For example, the solid pattern 136 is connected by the wiring pattern 138_1 including the ground electrode P2 and the through vias 137, is connected by the wiring pattern 138_3 to which the ground terminal GND1 is to be connected and the through vias 137, and is connected by the wiring pattern 138_4 to which the emitter electrode E is to be connected and the through vias 137.

More specifically, as illustrated in FIG. 3B, the solid pattern 136 is formed in a shape formed by cutting a region AR2 that is a part of the wiring pattern having a circular annular shape formed along a periphery of the through-hole 133 in the back surface 132, that is, the solid pattern 136 is formed in an alphabetic "C" shape. Here, the region AR2 is a region between the external electrode P3 and the transistor Q1 (the emitter electrode E).

As illustrated in FIG. 3B, the solid pattern 136 extends from a region overlapping with the ground electrode P2 to a region overlapping with the emitter electrode E of the transistor Q1 through a region overlapping with the ground terminal GND1 of the motor drive control IC 121, when viewing the substrate 130 from the back surface 132 side.

On the other hand, the wiring patterns other than the wiring patterns (for example, wiring patterns 138_1 to 138_4 and the solid pattern 136) to be supplied with the ground voltage VGND may be formed only on the main surface 131 of the substrate 130.

For example, the wiring pattern 141 connecting the external electrode (land) P4 and the first output terminal OUTA of the motor drive control IC 121, the wiring pattern 142 connecting the external electrode (land) P5 and the second output terminal OUTB of the motor drive control IC 121, the wiring pattern 143 connecting the output terminal OUTP of the magnetic detection element 122 and the first input terminal INP of the motor drive control IC 121, the wiring pattern 144 connecting the output terminal OUTN of the magnetic detection element 122 and the second input terminal INN of the motor drive control IC 121, the wiring pattern 145 connecting the power supply electrode P1 and the electronic components such as the motor drive control IC 121, and the wiring pattern 146 connecting the external electrode P3 and the signal output circuit 123 are formed only on the main surface 131.

In other words, the wiring pattern formed on the back surface 132 of the substrate 130 is only the solid pattern 136 to be supplied with the ground voltage VGND.

As described above, the circuit board 12 according to an embodiment of the present invention has the following effects.

That is, in the circuit board 12, the magnetic detection element 122 and the motor drive control IC 121 are arranged in the region AR1 on a side of the minor angle θ formed by the first straight line a and the second straight line b among the regions on the main surface 131 defined by the first straight line a and the second straight line b.

Accordingly, since the motor drive control IC 121 is arranged close to the lands P4 and P5 connected to the coil 17 of the motor 11 and the magnetic detection element 122, wiring lengths of the wiring patterns 141 and 142 connecting the motor drive control IC 121 and the lands P4 and P5 can be shortened. Thus, since the impedances of the wiring patterns 141 and 142 in which a large current for driving the coil 17 of the motor 11 flows can be reduced, an electromagnetic noise radiated by the circuit board 12 can be reduced, thereby enabling the EMI to be reduced.

In addition, since the motor drive control IC 121 is arranged close to the magnetic detection element 122, the wiring lengths of the wiring patterns 143 and 144 connecting the motor drive control IC 121 and the magnetic detection element 122 can be shortened.

Accordingly, since the impedances of the wiring patterns 143 and 144 can be reduced, the electromagnetic noise radiated by the circuit board 12 can be reduced, thereby enabling the EMI to be reduced. In addition, even when the electromagnetic noise is applied to the wiring patterns 143 and 144 from the outside, the influence of the electromagnetic noise on the detection signal output from the magnetic detection element 122 can be reduced, which can prevent the motor driving control circuit 120 from malfunctioning.

In addition, in the circuit board 12, the minor angle θ formed by the first straight line a and the second straight line b is set to 90 degrees or less, resulting that when the motor 11 is a single-phase brushless motor, the motor drive control IC 121, the lands P4 and P5, and the magnetic detection element 122 can be arranged closer to one another. Accordingly, the circuit board for a single-phase motor capable of further reducing the EMI can be provided.

In the circuit board 12 according to the present embodiment, the ground terminal GND1 of the motor drive control IC 121 and the emitter electrode E of the transistor Q1 are connected to the ground electrode P2 through wires common to each other. Specifically, the emitter electrode E of the transistor Q1 is connected to the ground electrode P2 through the ground connection path of the ground terminal GND1 of the motor drive control IC 121.

Accordingly, even when the electromagnetic noise is applied from the outside, the motor driving control circuit 120 can be prevented from malfunctioning. Hereinafter, the description will be made in detail.

Figure 4A:
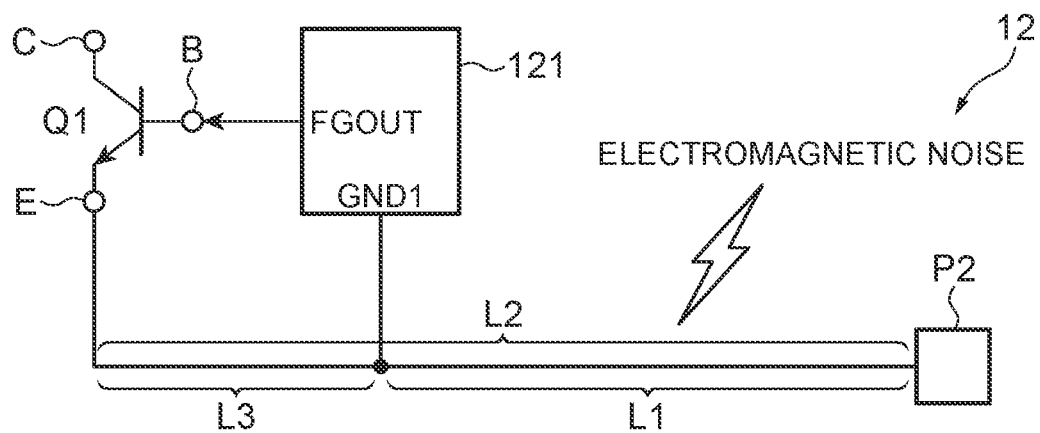
FIG. 4A A schematic diagram illustrating a connection relationship among the ground electrode P2, the emitter electrode E, and the ground terminal GND1 in the circuit board 12 according to an embodiment of the present invention.

FIG. 4A is a schematic diagram illustrating a connection relationship among the ground electrode P2, the emitter electrode E of the transistor Q1, and the ground terminal GND1 of the motor drive control IC 121.

Figure 4B:
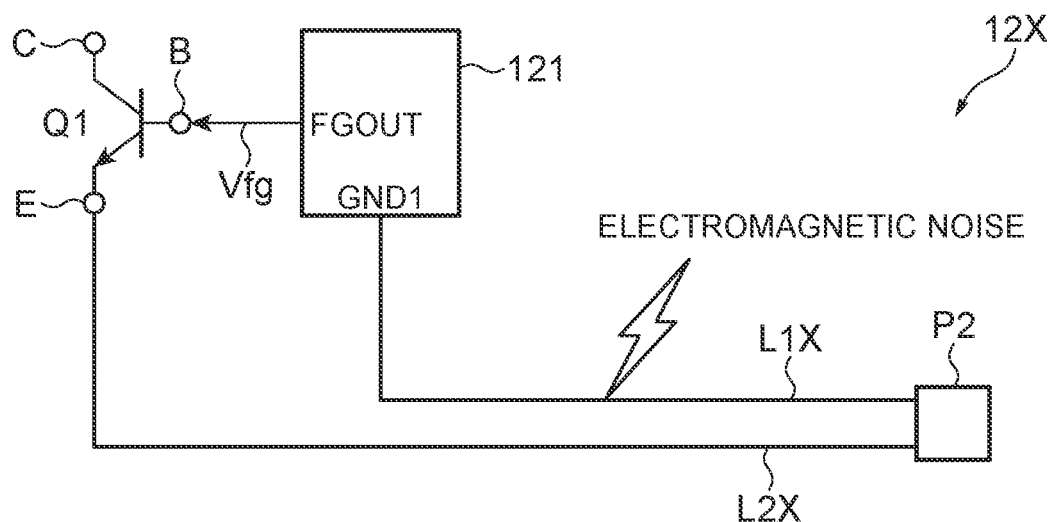
FIG. 4B A schematic diagram illustrating a connection relationship among the ground electrode P2, the emitter electrode E, and the ground terminal GND1, in a circuit board as a comparative example of the circuit board 12 according to the present embodiment.

FIG. 4B is a schematic diagram illustrating a connection relationship among the ground electrode P2, the emitter electrode E of the transistor Q1, and the ground terminal GND1 of the motor drive control IC 121, in a circuit board as a comparative example of the circuit board 12 according to the present embodiment.

As described above, in the circuit board 12 according to the present embodiment, the emitter electrode E of the transistor Q1 is connected to the ground electrode P2 through the ground connection path of the ground terminal GND1 of the motor drive control IC 121, the ground electrode P2 and the emitter electrode, and the ground terminal GND1 result in the connection relationship illustrated in FIG. 4A.

Specifically, as illustrated in FIG. 4A, a ground wire L2 connecting the ground electrode P2 and the emitter electrode E includes a ground wire L1 connecting the ground electrode P2 and the ground terminal GND1 and a ground wire L3 connecting the ground terminal GND1 and the emitter electrode E. In other words, a part of the ground wire L2 connecting the ground electrode P2 and the emitter electrode E coincides with the ground wire L1 connecting the ground electrode P2 and the ground terminal GND1. Here, the ground wire L1 corresponds to the above-described ground connection path of the ground terminal GND1.

Accordingly, the impedance components when viewing the ground electrode P2 side from the ground terminal GND1 of the motor drive control IC 121 are included as a part of the impedance components when viewing the ground electrode P2 side from the emitter electrode E of the transistor Q1.

In contrast, as in the circuit board 12X as a comparative example illustrated in FIG. 4B, when the emitter electrode E of the transistor Q1 and the ground terminal GND1 of the motor drive control IC 121 are connected to the ground electrode P2 through separate wiring patterns L1X and L2X, respectively, the wiring pattern L1X and the wiring pattern L2X have impedance components different from each other.

Therefore, in the circuit board 12X, when the electromagnetic noise is applied to, for example, the wiring pattern L1X from the outside, the voltage of the ground terminal GND1 of the motor drive control IC 121 and the voltage of the emitter electrode E of the transistor Q1 have different values, which may cause the transistor Q1 to malfunction.

For example, the transistor Q1 is normally turned off during a period in which the motor drive control IC 121 outputs the periodic signal Vfg of a low level. When in this period, the electromagnetic noise is applied to the wiring pattern L1X, and the voltage of the ground terminal GND1 of the motor drive control IC 121 becomes larger than the voltage (the ground voltage VGND) of the emitter electrode E of the transistor Q1, the voltage of the base electrode B of the transistor Q1 generated based on the voltage of the ground terminal GND1 also becomes larger than the voltage of the emitter electrode E. At this time, when the voltage of the base electrode B (that is, the low level of the periodic signal Vfg) becomes larger than a threshold of the voltage VBE between the base electrode B and the emitter electrode E of the transistor Q1, the transistor Q1 is turned on in spite of a period in which the transistor Q1 is to be turned off, resulting that an erroneous signal FG may be output.

In contrast, in the circuit board 12 according to the present embodiment, as illustrated in FIG. 4A, a part of the ground wire L2 connecting the ground electrode P2 and the emitter electrode E is common to the ground wire L1 connecting the ground electrode P2 and the ground terminal GND1, and therefore the impedance from the ground electrode P2 to the ground terminal GND1 and the impedance from the ground electrode P2 to the emitter electrode E are partially common to each other.

In the circuit board 12, when the electromagnetic noise is applied to the ground wire L1, the voltage of the ground terminal GND1 of the motor drive control IC 121 and the voltage of the emitter electrode E of the transistor Q1 vary in the same direction. That is, since the voltage of the base electrode B of the transistor Q1 and the voltage of the emitter electrode E vary in the same direction, a variation in the voltage VBE between the base electrode B and the emitter electrode E of the transistor Q1 can be suppressed as compared with in the above-described circuit board 12X.

Therefore, even when the electromagnetic noise is applied to the ground wire L1 in the period in which the motor drive control IC 121 outputs the periodic signal Vfg of a low level, the voltage of the base electrode B (that is, the low level of the periodic signal Vfg) does not exceed the threshold of the voltage VBE between the base electrode B and the emitter electrode E of the transistor Q1, which can prevent the transistor Q1 from malfunctioning.

Here, in the circuit board 12, it is preferable that the wire length of the ground wire L1 connecting the ground terminal GND1 and the ground electrode P2 is longer than the wire length of the ground wire L3 connecting the emitter electrode E and the ground terminal GND1.

Accordingly, since the impedance from the ground terminal GND1 to the emitter electrode E is smaller than the impedance from the ground terminal GND1 to the ground electrode P2, a difference between the variation width of the voltage of the emitter electrode E of the transistor Q1 and the variation width of the voltage of the ground terminal GND1 of the motor drive control IC 121 can be reduced. Thus, the variation in the voltage VBE between the base electrode B and the emitter electrode E of the transistor Q1 can be further suppressed, whereby the malfunction of the transistor Q1 can be effectively prevented.

In the circuit board 12, the discontinuous annular solid pattern 136 formed of a metal thin film is formed on the back surface 132 of the substrate 130, and the solid pattern 136 is connected to each of the ground electrode P2, the ground terminal GND1 of the motor drive control IC 121, and the emitter electrode E of the transistor Q1.

Accordingly, it is easy to connect the emitter electrode E of the transistor Q1 to the ground electrode P2 through the ground connection path of the ground terminal GND1 of the motor drive control IC 121.

For example, as illustrated in FIG. 3B, the solid pattern 136 extends from a region overlapping with the ground electrode P2 to a region overlapping with the emitter electrode E of the transistor Q1 through a region overlapping with the ground terminal GND1 of the motor drive control IC 121, when viewing the substrate 130 from the back surface 132 side, and therefore the emitter electrode E and the ground electrode P2 can be easily connected to each other through the ground connection path of the ground terminal GND1.

In the circuit board 12, the wiring patterns other than the wiring patterns to be supplied with the ground voltage is formed only on the main surface 131 of the substrate 130.

Accordingly, since the through vias are not required for wires connecting the power supply electrode P1 and the motor drive control IC 121 or the like, and wires for connecting the motor drive control IC 121 and the external electrodes P3 and P4, the impedances of the wires can be reduced as compared with a case where the through vias are used. Thus, the electromagnetic noise radiated by the wires other than wires to be supplied with the ground voltage can be suppressed, and even when the electromagnetic noise is incident to the wires from the outside, the motor driving control circuit 120 can be prevented from malfunctioning.

Thus, according to the circuit board 12 of the present embodiment, the electromagnetic noise radiated by the circuit board 12 can be suppressed (suppression of EMI), and the motor driving control circuit 120 can be prevented from malfunctioning due to the electromagnetic noise that is incident from the outside (improvement of EMS).

Figure 5A:
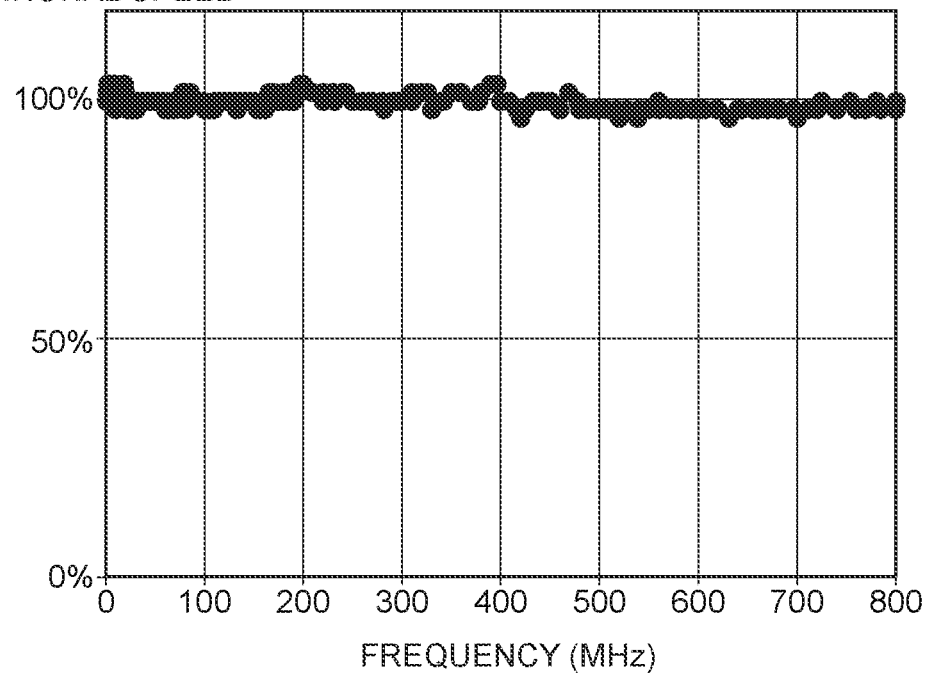
FIG. 5A A graph illustrating a specific example of a result of a BCI test of the motor unit 10 adopting the circuit board 12 according to the present embodiment.
Figure 5B:
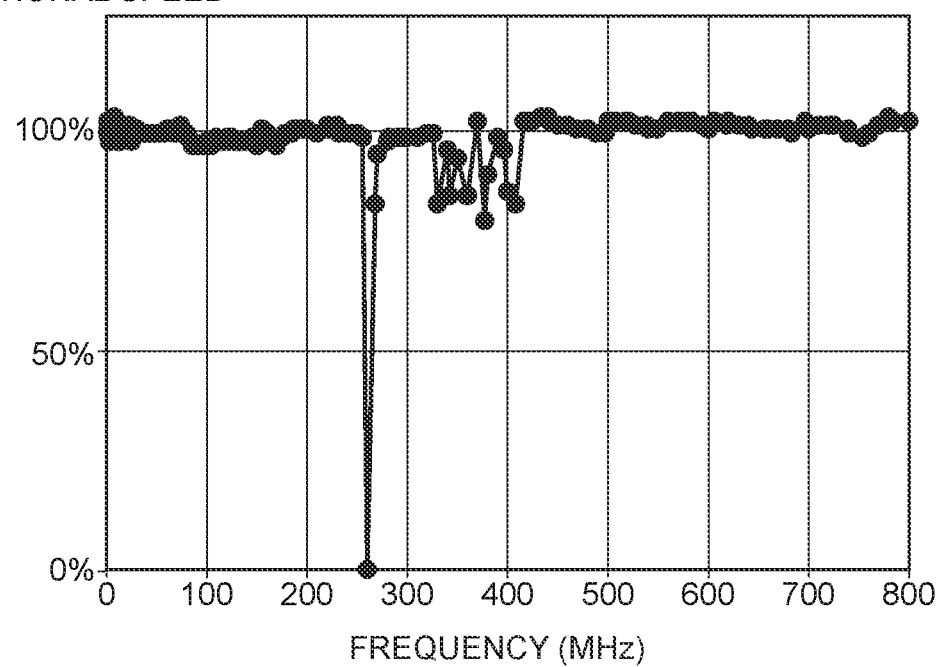
FIG. 5B A graph illustrating a specific example of a result of the BCI test of the motor unit adopting the conventional circuit board as a comparative example of the circuit board 12 according to the present embodiment.

FIG. 5A is a graph showing, as an example of an EMC test, a specific example of a result of a bulk current injection (BCI, ISO11452_4) test of the motor unit 10 adopting the circuit board 12 according to the present embodiment. FIG. 5B is a graph showing a specific example of a result of the BCI test of the motor unit 10 adopting the conventional circuit board as a comparative example of the circuit board 12 according to the present embodiment. Note that the BCI test is a test for evaluating the durability when strong electromagnetic noise is induced on a harness connected to the electronic device.

In FIGS. 5A and 5B, the horizontal axis represents a measurement frequency of noise to be applied, and the vertical axis represents a rate of the rotational speed of the motor to the rated rotational speed when the rated rotational speed of the motor is 100%.

As shown in FIG. 5B, when the conventional circuit board in which the EMC measures taken in the circuit board 12 according to the present embodiment are not taken is used, it can be seen that the rotational speed of the motor becomes unstable within a frequency range from 200 MHz to 500 MHz. In contrast, in the motor unit 10 adopting the circuit board 12 according to the present embodiment, as shown in FIG. 5A, it can be seen that the rotational speed of the motor is stable at any frequency within a measurement frequency range (0 Hz to 800 MHz).

Thus, when the circuit board 12 according to the present embodiment is adopted as a circuit board of the motor unit 10, the EMC performance of the motor unit 10 including the circuit board 12 and the motor 11 can be improved, and the EMC performance of the fan 1 including the motor unit 10 and the impeller 30 can be improved.

Expansion of Embodiments

In the foregoing, the invention made by the inventors of the present invention has been concretely described based on the embodiments. However, it is needless to say that the present invention is not limited to the embodiments and various modifications and alterations can be made without departing from the scope of the present invention.

For example, although the above-described embodiments illustrate a case where in the substrate 130, the emitter electrode E is connected to the ground electrode P2 through the ground connection path of the ground terminal GND1, the ground terminal GND1 may be connected to the ground electrode P2 through the connection path connecting the emitter electrode E and the ground electrode P2 (the ground connection path of the emitter electrode E). For example, as in FIG. 3B, the solid pattern 136 may be formed in a "C" shape extending from a region overlapping with the ground electrode P2 to a region overlapping with the ground terminal GND1 through a region overlapping with the emitter electrode E. In this case, the region AR2 is a region between the ground electrode P2 and the ground terminal GND1 when viewing from the back surface 132 side.

Accordingly, the transistor Q1 can be prevented from malfunctioning due to the electromagnetic noise, similarly to the case where the emitter electrode E is connected to the ground electrode P2 through the ground connection path of the ground terminal GND1.

Although here is illustrated a case where the ground electrode P2 is formed on the main surface 131 of the substrate 130, the ground electrode P2 may be formed on the back surface 132 of the substrate 130.

Although the above-described embodiments illustrate a case where a contour of the substrate 130 is a circular shape in a plan view, the contour of the substrate 130 is not limited thereto, and may be, for example, a rectangular shape (for example, a square shape), or other shapes. In addition, although the above-described embodiments illustrate a case where the through-hole 133 formed in the substrate 130 is formed in a circular shape in a plan view, the shape of the through-hole 133 is not limited thereto, and may be, for example, a rectangular shape (for example, a square shape). Furthermore, the position of the through-hole 133 is not limited to a center portion of the substrate 130, and the through-hole 133 may be formed in another position of the substrate 130. The through-hole 133 may not be formed in the substrate 130. In this case, it is only required that the output shaft 18, the bearing 19, and the bearing housing 20 are arranged in a region corresponding to the through-hole 133 in FIGS. 3A and 3B.

Although the above-described embodiments illustrate a case where the transistor Q1 is a bipolar transistor, the transistor Q1 may be another type of transistor such as a field effect transistor (FET) and an insulated gate bipolar transistor (IGBT).

Although the above-described embodiments illustrate a case where the circuit board 12 is a circuit board for a single-phase brushless motor, the circuit board 12 is not limited thereto. For example, also in the circuit board for a multiple-phase (for example, three phase) brushless motor, the wiring pattern may be formed so that the emitter electrode E is connected to the ground electrode P2 through the ground connection path of the ground terminal GND1. In this case, the wiring patterns other than the wiring patterns to be supplied with the ground voltage VGND may be formed only on the main surface 131.

Although the above-described embodiments illustrate a case where the magnetic detection element 122 is a Hall element, the magnetic detection element 122 may be a Hall IC including the Hall element and the other peripheral circuit.

Although the above-described embodiments illustrate a case where the substrate 130 is a double-sided substrate, the substrate 130 may be a multilayer substrate having three or more of wire layers.

A configuration of the fan 1 is not limited to a configuration illustrated in FIG. 1. For example, if the configuration is achieved as the function of the fan when the circuit board 12 is adopted, the components may be added or changed.

The shape of the wiring pattern formed on the circuit board 12 and the shape of the package of the electronic components such as the motor drive control IC 121 are not limited to the shapes illustrated in FIGS. 3A and 3B. If the object can be achieved, various shapes can be adopted.

Although the above-described embodiments illustrate a case where the motor drive control IC 121 controls the motor 11 based on the detection signal from the magnetic detection element 122, the motor drive control IC 121 may be a sensorless motor control IC that does not require a Hall element. In this case, the magnetic detection element 122 may not be mounted on the circuit board 12.

LIST OF REFERENCE SIGNS

1 fan,
10 motor unit,
11 motor,
12 circuit board,
13 stator,
14 rotor,
15 stator core,
16 insulator,
17 coil,
18 output shaft,
19 bearing,
20 bearing housing,
21 magnet,
22 rotor yoke,
30 impeller,
40 case,
41, 42 opening,
120 motor driving control circuit
121 motor drive control IC
122 magnetic detection element
123 signal output circuit,
Q1 transistor,
R1 to R5 resistor,
C1 to C3 capacitor,
130 substrate,
131 main surface,
132 back surface,
133, 134, 135 through-hole,
136 solid pattern,
137 through via,
138_1 to 184_4, 141 to 146 wiring pattern,
P1 external electrode (power supply electrode),
P2 external electrode (ground electrode),
P3 external electrode,
P4 land (an example of first land, external electrode),
P5 land (an example of second land, external electrode),
VCC1 power supply terminal,
GND1 ground terminal,
OUTA first output terminal,
OUTB second output terminal,
FGOUT third output terminal,
INP first input terminal,
INN second input terminal,
VCC2 power supply terminal,
GND2 ground terminal,
OUTP, OUTN output terminal,
B base electrode (an example of control electrode),
E emitter electrode (an example of first main electrode),
C collector electrode (an example of second main electrode),
a first straight line,
b second straight line,
S position of axis of output shaft 18,
AR1, AR2 region,
VGND ground voltage,
VCC power supply voltage,
VOUTA, VOUTB drive signal,
Vfg periodic signal,
FG signal

The invention claimed is:

1. A circuit board of a motor unit on which a motor is mounted, comprising:
   a substrate having a main surface which is one of a pair of surfaces facing back to back each other and a back surface which is another of the pair of surfaces;
   a first land and a second land that are formed on the main surface and are for connecting a coil of the motor;
   a magnetic detection element that outputs a detection signal corresponding to a position of a rotor of the motor; and
   a motor drive control IC that generates drive signals for driving the motor based on the detection signal,
   wherein the magnetic detection element and the motor drive control IC are arranged in a region on a side of a minor angle formed by a first straight line and a second straight line among regions that are on the main surface and are defined by the first straight line and the second straight line when viewing the substrate from the main surface side, the first straight line connecting the first land and an axis of an output shaft of the motor, the second straight line connecting the second land and the axis of the motor.

2. The circuit board according to claim 1, wherein the minor angle formed by the first straight line and the second straight line is 90 degrees or less.

3. The circuit board according to claim 1, further comprising:
a ground electrode that is formed on one of the main surface and the back surface and is supplied with a ground voltage from an outside; and
a transistor that includes a control electrode, a first main electrode connected to the ground electrode, and a second main electrode and that is arranged on the main surface,
wherein the motor drive control IC includes a ground terminal for inputting the ground voltage, a first input terminal and a second input terminal each for inputting the detection signal, a first output terminal and a second output terminal that output the drive signals generated based on the detection signals input from the first input terminal and the second input terminal, respectively, and a third output terminal that outputs a periodic signal corresponding to a rotational speed of the motor generated based on the voltage input to the ground terminal,
the control electrode of the transistor is connected to the third output terminal of the motor drive control IC, and
on the substrate, the ground terminal and the first main electrode are connected to the ground electrode through wires common to each other.

4. The circuit board according to claim 3, wherein in the substrate, one of the first main electrode and the ground terminal is connected to the ground electrode through a ground connection path connecting another of the first main electrode and the ground terminal and the ground electrode.

5. The circuit board according to claim 4, further comprising:
a discontinuous annular solid pattern formed of a metal thin film that is formed on the back surface of the substrate,
wherein the solid pattern is connected to the ground electrode, the ground terminal and the first main electrode.

6. The circuit board according to claim 5, wherein the solid pattern extends from a region overlapping with the ground electrode to a region overlapping with the first main electrode through a region overlapping with the ground terminal, when viewing the substrate from the back surface side.

7. The circuit board according to claim 3, wherein the substrate has a plurality of wiring patterns, and the wiring patterns other than the wiring patterns to be supplied with the ground voltage among the plurality of wiring patterns are formed only on the main surface.

8. A circuit board of a motor unit on which a motor is mounted, comprising:
a substrate having a main surface which is one of a pair of surfaces facing back to back each other and a back surface which is another of the pair of surfaces;
a ground electrode that is formed on any one of the main surface and the back surface and is supplied with a ground voltage from an outside;
a motor drive control IC that is arranged on the main surface of the substrate and generates a drive signal for driving the motor and generates a periodic signal having a frequency corresponding to a rotational speed of the motor; and
a transistor that includes a control electrode, a first main electrode connected to the ground electrode, and a second main electrode and that is arranged on the main surface,
wherein the motor drive control IC include a ground terminal for inputting the ground voltage, a first output terminal and a second output terminal that output the respective drive signals, and a third output terminal that outputs the periodic signal generated with a voltage of the ground terminal as a reference,
the control electrode of the transistor is connected to the third output terminal of the motor drive control IC, and
on the substrate, the ground terminal and the first main electrode are connected to the ground electrode through wires common to each other.

9. The circuit board according to claim 8, wherein on the substrate, one of the first main electrode and the ground terminal is connected to the ground electrode through a ground connection path connecting another of the first main electrode and the ground terminal and the ground electrode.

10. The circuit board according to claim 9, further comprising:
a discontinuous annular solid pattern formed of a metal thin film that is formed on the back surface of the substrate,
wherein the solid pattern is connected to the ground electrode, the ground terminal and the first main electrode.

11. The circuit board according to claim 10, wherein the solid pattern extends from a region overlapping with the ground electrode to a region overlapping with the first main electrode through a region overlapping with the ground terminal, when viewing the substrate from the back surface side.

12. The circuit board according to claim 8, wherein the substrate has a plurality of wiring patterns, and the wiring patterns other than the wiring patterns to be supplied with the ground voltage among the plurality of wiring patterns are formed only on the main surface.

13. A motor unit comprising:
the circuit board according to claim 1; and
the motor.

14. A fan comprising:
the motor unit according to claim 13; and
an impeller configured to be rotatable by a rotational force of the motor.

* * * * *